United States Patent
Ahn

[11] Patent Number: 5,874,330
[45] Date of Patent: Feb. 23, 1999

[54] METHOD FOR FABRICATING SEMICONDUCTOR DEVICE

[75] Inventor: Jae Gyung Ahn, Cheongju-si, Rep. of Korea

[73] Assignee: LG Semicon Co., Ltd, Chungcheongbuk-do, Rep. of Korea

[21] Appl. No.: 744,274

[22] Filed: Nov. 6, 1996

[30] Foreign Application Priority Data

Jun. 10, 1996 [KR] Rep. of Korea .................. 1996/20641

[51] Int. Cl.⁶ ........................ H01L 27/092; H01L 29/784
[52] U.S. Cl. ........................ 438/230; 438/275; 438/278; 438/303; 438/305
[58] Field of Search ................................... 438/230, 231, 438/232, 275, 303, 305, 307, 595, 199, 182, 204, 450, 214, 168, 216, 217, 218

[56] References Cited

U.S. PATENT DOCUMENTS

| | | | |
|---|---|---|---|
| 4,536,944 | 8/1985 | Bracco et al. | |
| 5,021,353 | 6/1991 | Lowrey et al. | 438/231 |
| 5,155,056 | 10/1992 | Jeong-Gyoo | 437/47 |
| 5,324,680 | 6/1994 | Lee et al. | 438/305 |
| 5,371,026 | 12/1994 | Hayden et al. | 438/275 |
| 5,405,791 | 4/1995 | Anmad et al. | 438/231 |
| 5,696,016 | 12/1997 | Chen et al. | 438/305 |

FOREIGN PATENT DOCUMENTS

| | | |
|---|---|---|
| 1-147856 | 6/1989 | Japan . |
| 1-165159 | 6/1989 | Japan . |
| 3-41763 | 2/1991 | Japan . |
| 3-209762 | 9/1991 | Japan . |

OTHER PUBLICATIONS

Stanley Wolf Silicon Processing For the VSLI ERA vol. 3 Lattice Press pp. 609–611, 635, 1995.

*Primary Examiner*—Charles Bowers
*Assistant Examiner*—David S. Blum
*Attorney, Agent, or Firm*—Morgan, Lewis & Bockius LLP

[57] ABSTRACT

A method for fabricating a semiconductor device having a substrate includes the steps of defining a first region and a second region in the substrate, forming a gate insulator over the substrate at each of the first and second regions, forming a gate electrode over the gate insulator and forming impurity regions in the substrate at adjacent sides of the gate electrode in each of the first and second regions, forming a first insulating layer on top and at sides of the gate electrode in the first region, forming a second insulating layer on the first insulating layer at the first region and on the gate electrode of the second region, removing the second insulating layer by selective etching and forming gate sidewalls at the second region, and forming lightly doped drain areas by injecting ions using the gate sidewalls at the second region and the second insulating layer at the first region as masks.

5 Claims, 4 Drawing Sheets

METHOD FOR FABRICATING SEMICONDUCTOR DEVICE

BACKGROUND OF THE INVENTION

1. Field of the Invention

The present invention relates to a semiconductor device, and more particularly, to a method for fabricating a semiconductor device having two or more optimized regions.

2. Discussion of the Related Art

The self-aligned contact technique employed in processes for fabricating a semiconductor device, such as a DRAM, is a technique for forming sidewalls of a gate electrode in a cell region with a nitride which has a better selectivity than an oxide to secure an adequate process for contact etching. In this regard, a conventional method for fabricating a semiconductor device will be explained with reference to the attached drawings.

FIGS. 1a–1c illustrate sectional views showing steps for fabricating a conventional semiconductor device. As shown in FIG. 1a, when forming sidewalls according to the conventional method, a nitride is deposited on an entire surface of a semiconductor substrate 1 having a gate electrode 2 formed thereon. The nitride is then dry etched into nitride sidewalls 3 at sides of the gate electrode 2. Then, as shown in FIG. 1b, an oxide film 4 is deposited on the entire resulting surface. Portions of the oxide film 4 on an impurity region at a predetermined part of the semiconductor substrate 1 is selectively etched to form a contact hole. Then, a metal layer is formed on the entire resulting surface including the contact hole. The metal layer is subjected to patterning to form metal wiring.

In the aforementioned conventional self-aligned contact technique using sidewalls, each of the material for forming the sidewalls at sides of the gate electrode 2 and the material for forming an interlayer insulating film for forming the metal wiring has a large etch selectivity with respect to each other. Therefore, even if there is a slight misalignment in the contact etch process, it does not cause any difficulty in the formation of the contact hole.

However, the use of an identical nitride in the formation of sidewalls for an element in a cell region as well as for an element in a peripheral circuit has caused problems as follows.

First, the use of nitride in the formation of sidewalls for an element in a peripheral circuit increases an overlap capacitance of the gate-source electrodes, and causes an adverse effect on the device due to an increase in hot carrier generation. Second, the decrease in sidewall size for obtaining a larger contact hole in the cell region degrades performance of the element in a peripheral circuit. On the other hand, an increase in the sidewall size with a decrease in the contact hole size causes defects in the wiring.

SUMMARY OF THE INVENTION

Accordingly, the present invention is directed to a method for fabricating a semiconductor device that substantially obviates one or more of the problems due to limitations and disadvantages of the related art.

An object of the present invention is to provide an improved method for fabricating a semiconductor device to improve its reliability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for fabricating a semiconductor device includes the steps of providing semiconductor substrate having a first region and a second region, forming a gate electrode and impurity regions in the substrate on both sides of the gate electrode in each of the first and second regions, forming a first insulating layer on top and at sides of the gate electrode in the first region, forming a second insulating layer on the first insulating layer and on the substrate including the gate electrode in the second region, and subjecting the second insulating layer to selective etching for leaving the second insulating layer only at both sides of the gate electrode in the second region, on the first insulating layer at both sides of the gate electrode in the first region, and on the substrate.

In another aspect, the present invention provides a method for fabricating a semiconductor device having a substrate, the method comprising the steps of defining a first region and a second region in the substrate, forming a gate insulator over the substrate at each of the first and second regions, forming a gate electrode over the gate insulator and forming impurity regions in the substrate at adjacent sides of the gate electrode in each of the first and second regions, forming a first insulating layer on top and at sides of the gate electrode in the first region, forming a second insulating layer on the first insulating layer at the first region and on the gate electrode of the second region, removing the second insulating layer by selective etching and forming gate sidewalls at the second region, and forming lightly doped drain areas by injecting ions using the gate sidewalls at the second region and the second insulating layer at the first region as masks.

In further aspect, the present invention provides a method for fabricating a semiconductor device, including the steps of providing a semiconductor device having a substrate, the method comprising the steps of defining a first region and a second region in the substrate, forming a gate insulator over the substrate at each of the first and second regions of the substrate, forming a gate electrode on the gate insulator in each of the first and second regions, forming impurity regions in the substrate at adjacent sides of the gate electrode at each of the first and second regions, forming a first insulating layer on top and at sides of the gate electrode in each of the first and second regions, forming a photoresist layer on the first insulating layer and the substrate in the first region, removing the first insulating layer at the second region by selective etching using the photoresist as a mask, removing the photoresist layer at the first region, forming an oxide layer over the gate electrode at the second region and the first insulating layer at the first region, removing the oxide layer at the second region to expose a top portion of the gate electrode and forming gate sidewalls at the second region, removing a portion of the oxide layer at the first region, the amount of the oxide layer removed at the first region being dependent on a width of the sidewalls at the second region, forming lightly doped drain areas at the second region using the oxide layer remaining at the first region as a mask, forming a second oxide layer over a resultant structure at the first and second regions, and forming a contact hole at the first region through the first and second oxide layers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENT

Reference will now be made in detail to the preferred embodiments of the present invention, examples of which are illustrated in the accompanying drawings.

A method for fabricating a semiconductor device in accordance with one preferred embodiment of the present invention will now be explained in detail with reference to the attached drawings.

FIGS. 2a to 2g illustrate sectional views showing steps for fabricating a semiconductor device in accordance with the present invention, wherein the "I" region represents a cell region and the "II" region represents a peripheral circuitry region.

Figure 1A:
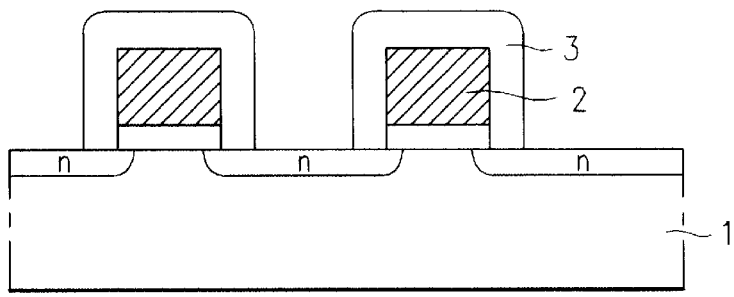
FIGS. 1a to 1c illustrate sectional views showing steps for fabricating a conventional semiconductor device.
Figure 1B:
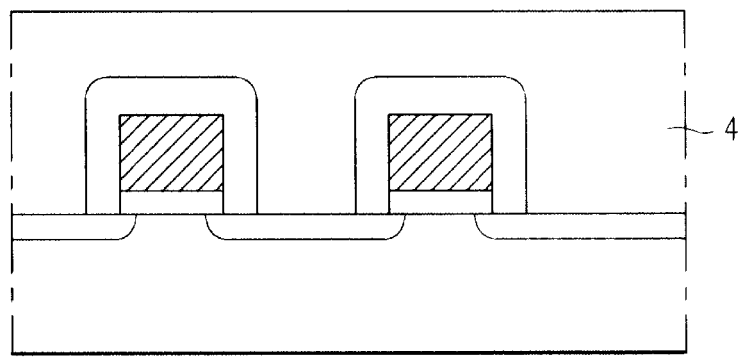
Figure 1C:
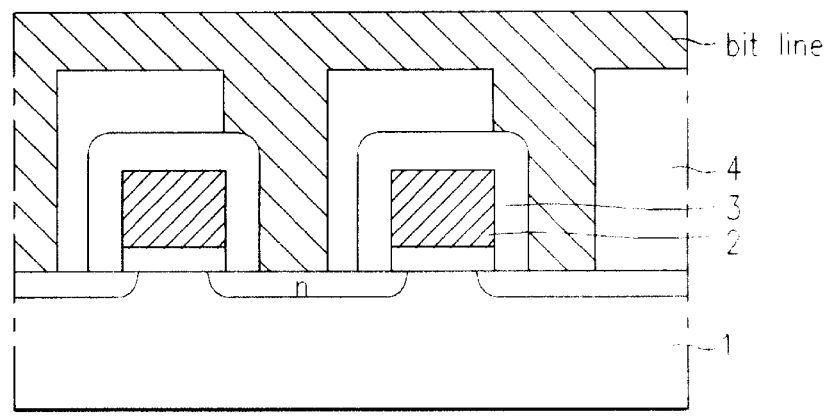
Figure 2A:
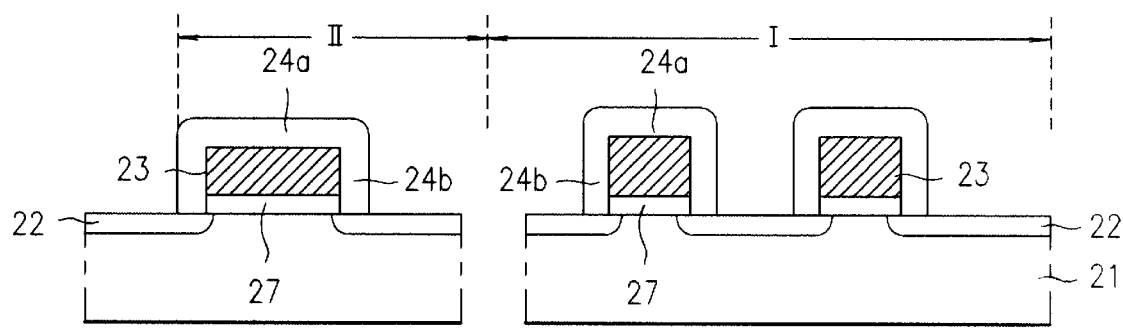
FIGS. 2a to 2g illustrate sectional views showing steps for fabricating a semiconductor device in accordance with the present invention.

As shown in FIG. 2a, impurity diffusion regions 22 are formed on a substrate 21. The substrate 21 includes a cell region I and a peripheral circuitry region II. Gate electrodes 23 are formed on gate insulators 27 over the impurity diffusion regions 22 and the substrate. A nitride is deposited on an entire surface of a semiconductor substrate 21 having the impurity diffusion regions 22 formed therein using the gate electrode 23 as a mask. Then, the nitride layer is subjected to selective dry etching to form a cap nitride layer 24a and nitride sidewalls 24b on top and sides of the gate electrode 23 at both the cell region and the peripheral circuitry region.

Figure 2B:
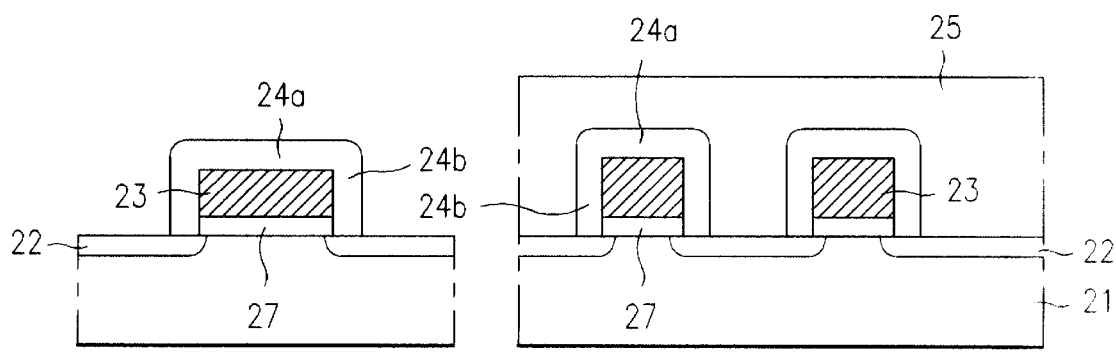
Figure 2C:
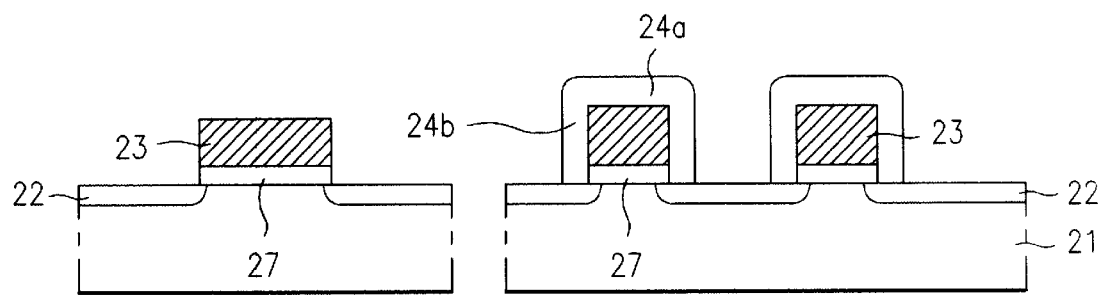

As shown in FIGS. 2b and 2c, a photoresist layer 25 is formed on an entire resultant surface of the cell region I. The cap nitride layer 24a and the nitride sidewalls 24b on top and sides of the gate electrode 23 in the peripheral circuitry region II are removed. Then, the photoresist layer 25 formed in the cell region I and used as a mask is removed.

Figure 2D:
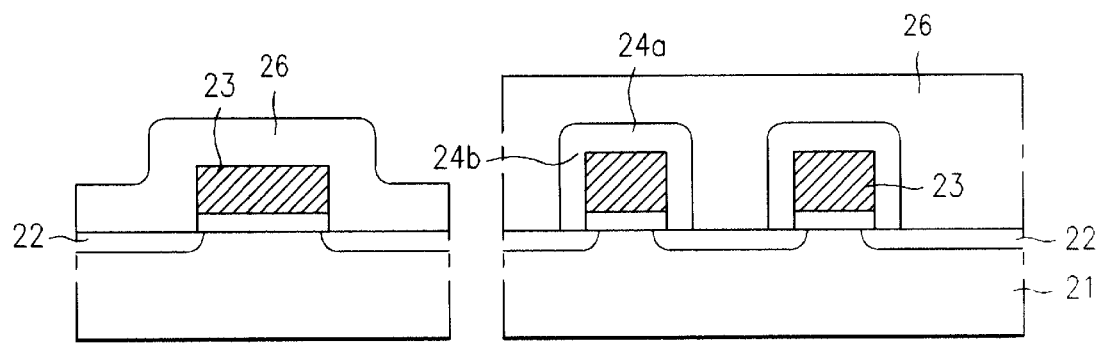
Figure 2E:
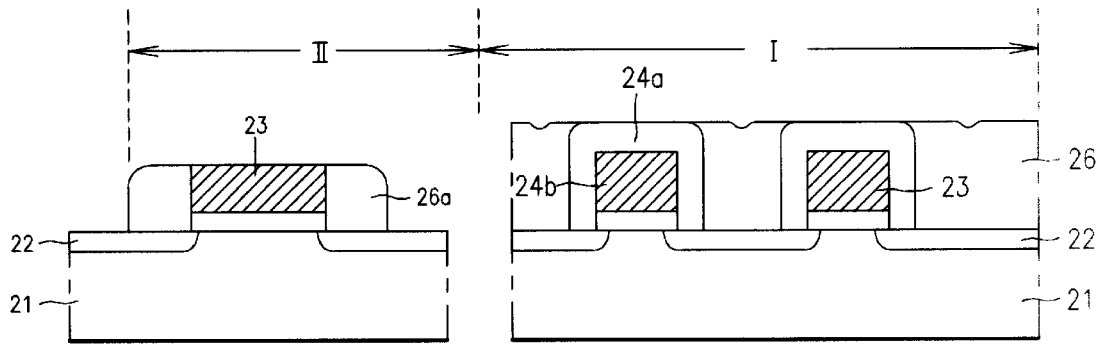

As shown in FIGS. 2d and 2e, an oxide film 26 having a thickness different from the nitride layers 24a and 24b is formed on the entire resultant surface including the surfaces of the cell region I and the peripheral circuitry region HI. The oxide film 26 is then etched to form gate sidewalls 26a at sides of the gate electrode 23 in the peripheral circuitry region II. Simultaneously, the oxide film 26 in the cell region I is partially removed such that some of the oxide film 26 remains. Here, the amount or thickness of the remaining oxide film 26 at the side cell region depends on the width of the sidewalls formed at sides of the gate electrode 23 in the peripheral circuitry region II. That is, depending on the amount of oxide film that was etched at the sidewalls of the peripheral circuitry region, the thickness of the remaining oxide film 26 changes.

Figure 2F:
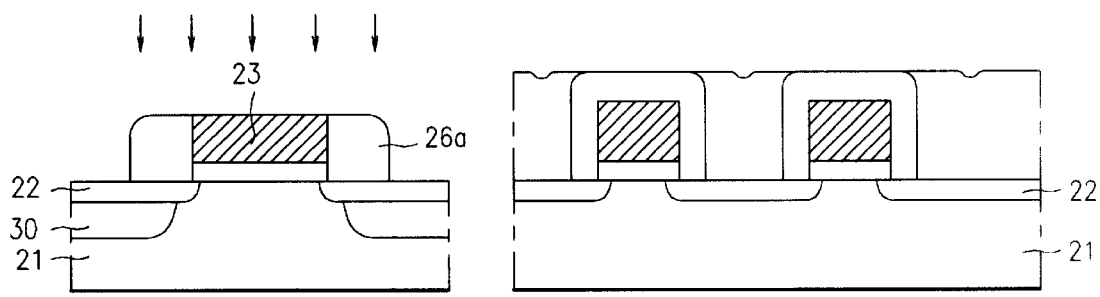
Figure 2G:
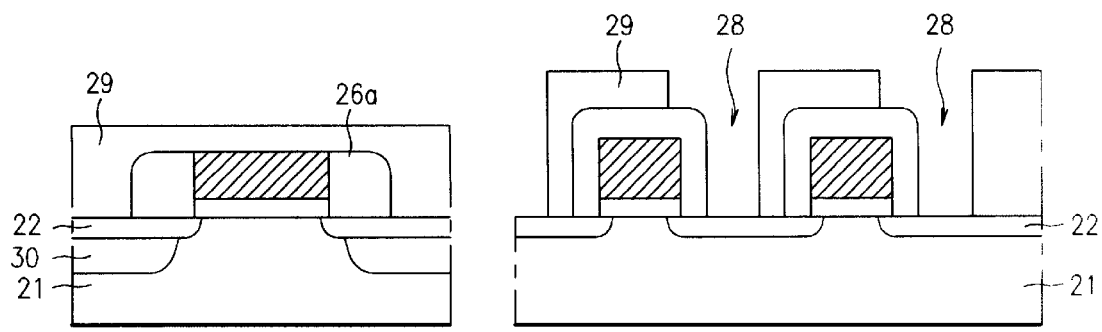

As shown in FIGS. 2f and 2g, source/drain regions 30 are formed by injecting ions into the substrate 21 using the gate electrode 23 having the gate sidewalls 26a in the peripheral circuitry region II as a mask. Here, the remaining oxide film 26 at the cell region I also acts as masks. Then, as shown in FIG. 2g, an oxide layer 29 is formed on the entire resultant structure and then contact holes 28 are formed through the oxide layers 29 at the cell region I.

Thus, the present invention forms sidewalls at two regions and optimization for each of the regions is possible. Accordingly, the method for fabricating a semiconductor device in accordance with the present invention has the following advantages.

The present invention allows for an easy adjustment of the sidewall thickness in the cell region for a required performance and secures an adequate process for forming the contact holes. Moreover, using the oxide film in the formation of the sidewalls in parts other than the cell region and the availability of wider sidewalls help reduce both the overlap capacitance between the gate and source as well as short channel effects, thus improving the performance of the device.

Accordingly, the present invention provides a method for fabricating a semiconductor device including formation of sidewalls in two regions where each of the regions is optimized in fabrication of a device such as a DRAM to improve the reliability of the device.

It will be apparent to those skilled in the art that various modifications and variations can be made in the method for fabricating semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device having a substrate, the method comprising the steps of:

defining a cell region and a peripheral region in the substrate;

forming a gate insulator over the substrate at each of the cell and peripheral regions;

forming a gate electrode over the gate insulator and forming first impurity regions in the substrate at adjacent sides of the gate electrode in each of the cell and peripheral regions;

forming a first insulating layer of a nitride on top and at sides of the gate electrode in the cell region to form nitride spacers on sides of the gate electrode in the cell region and a nitride cap over the gate electrode in the cell region;

forming a second insulating layer of an oxide on the first insulating layer at the cell region and on the gate electrode of the peripheral region;

removing the second insulating layer by selective etching and forming gate sidewalls at the peripheral region; and forming second impurity regions by injecting ions using the gate sidewalls at the peripheral region and the second insulating layer at the cell region as masks.

2. A method as claimed in claim 1, wherein a thickness of the second insulating layer in the first region is dependent on a width of the gate sidewalls in the second region.

3. A method as claimed in claim 1, further comprising the steps of:

forming a third insulating layer on a resultant structure at the first and second regions; and forming a contact hole at the first region through the second and third insulating layers.

4. A method for fabricating a semiconductor device having a substrate, the method comprising the steps of:

defining a cell region and a peripheral region in the substrate;

forming a gate insulator over the substrate at each of the cell and peripheral regions of the substrate;

forming a gate electrode on the gate insulator in each of the cell and peripheral regions;

forming first impurity regions in the substrate at adjacent sides of the gate electrode at each of the cell and peripheral regions;

forming a first insulating layer of a nitride on top and at sides of the gate electrode in each of the cell and peripheral regions;

forming a photoresist layer on the first insulating layer and the substrate in the cell region;

removing the first insulating layer at the peripheral region by selective etching using the photoresist as a mask to form nitride spacers on sides of the gate electrode in the cell region and a nitride cap over the gate electrode in the cell region;

removing the photoresist layer at the cell region;

forming an oxide layer over the gate electrode at the peripheral region and the first insulating layer at the cell region;

removing the oxide layer at the peripheral region to expose a top portion of the gate electrode and forming gate sidewalls at the peripheral region;

removing a portion of the oxide layer at the cell region, the amount of the oxide layer removed at the cell region being dependent on a width of the sidewalls at the peripheral region; and forming second impurity regions at the peripheral region using the oxide layer remaining at the cell region as a mask.

5. The method as claimed in claim 4, wherein the steps of removing the oxide layer at the peripheral region and removing a portion of the oxide layer at the cell region are carried out simultaneously.

* * * * *